US009496290B2

(12) United States Patent
Cheng et al.

(10) Patent No.: US 9,496,290 B2
(45) Date of Patent: Nov. 15, 2016

(54) DISPLAY SUBSTRATE, DISPLAY DEVICE AND METHOD FOR MANUFACTURING DISPLAY SUBSTRATE

(71) Applicant: BOE TECHNOLOGY GROUP CO., LTD., Beijing (CN)

(72) Inventors: Hongfei Cheng, Beijing (CN); Jianbo Xian, Beijing (CN); Yong Qiao, Beijing (CN); Wenbo Li, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/552,915

(22) Filed: Nov. 25, 2014

(65) Prior Publication Data

US 2015/0372015 A1 Dec. 24, 2015

(30) Foreign Application Priority Data

Jun. 23, 2014 (CN) ...................... 2014 2 0336953 U

(51) Int. Cl.
*H01L 27/12* (2006.01)
*H01L 29/786* (2006.01)

(52) U.S. Cl.
CPC ......... *H01L 27/124* (2013.01); *H01L 27/1255* (2013.01); *H01L 29/7869* (2013.01)

(58) Field of Classification Search
CPC ................... H01L 27/1214; H01L 2021/775; H01L 27/3248
USPC .......................... 257/71, 68, 72; 438/239, 80
See application file for complete search history.

(56) References Cited

U.S. PATENT DOCUMENTS

| 6,043,605 A | * | 3/2000 | Park | H01J 11/14 313/567 |
| 2004/0119898 A1 | * | 6/2004 | Song | G02F 1/1393 349/38 |
| 2008/0185959 A1 | * | 8/2008 | Kurauchi | H01L 51/5228 313/504 |
| 2010/0128192 A1 | * | 5/2010 | Kim | G02F 1/134363 349/46 |
| 2013/0214278 A1 | * | 8/2013 | Nam | H01L 27/1214 257/59 |

* cited by examiner

*Primary Examiner* — Moazzam Hossain
*Assistant Examiner* — Omar Mojaddedi
(74) *Attorney, Agent, or Firm* — Nath, Goldberg & Meyer; Joshua B. Goldberg

(57) ABSTRACT

The present disclosure relates to a display substrate, a display device and a method for manufacturing the display substrate. The display substrate comprises a substrate, and a plurality of gate lines, a plurality of data lines and a plurality of common electrode lines which are formed above the substrate. The plurality of gate lines and the plurality of data lines are crossed to form a plurality of pixel units. Each of the plurality of pixel units comprises a thin film transistor and a pixel electrode electrically connected to the thin film transistor. The display substrate further comprises connection electrodes located above the substrate. Each of the connection electrodes connects two adjacent common electrode lines.

16 Claims, 3 Drawing Sheets

DISPLAY SUBSTRATE, DISPLAY DEVICE AND METHOD FOR MANUFACTURING DISPLAY SUBSTRATE

FIELD OF THE INVENTION

The present disclosure relates to the field of display technology, and particularly relates to a display substrate and a display device.

BACKGROUND OF THE INVENTION

The liquid crystal display technology, as one of most widely used display technologies at present, is widely applied in TV sets, mobile phones, public information display and other fields. The image quality of the liquid crystal display is an important technical index for products using the liquid crystal display technology. A liquid crystal display device is one of common displays at present, and a Thin Film Transistor Liquid Crystal Display (TFT-LCD) is a mainstream product among various liquid crystal display devices.

An array substrate is an important component of the liquid crystal display device. In the prior art, generally, the array substrate is provided therein with a common electrode line for providing the common voltage required by the liquid crystal display device.

However, the common electrode line has high resistance, so a voltage drop on the common electrode line is also high, so that the homogeneity of display is reduced.

SUMMARY OF THE INVENTION

The present disclosure provides a display substrate and a display device for improving the homogeneity of display.

According to one aspect of the present disclosure, a display substrate is provided, which includes a substrate, and a plurality of gate lines, a plurality of data lines and a plurality of common electrode lines which are formed above the substrate, the plurality of gate lines and the plurality of data lines being crossed with each other to form a plurality of pixel units, each of the plurality of pixel units including a thin film transistor and a pixel electrode electrically connected to the thin film transistor. The display substrate further includes connection electrodes located above the substrate, each of the connection electrodes connecting two adjacent common electrode lines.

According to an embodiment of the present disclosure, the connection electrodes and the plurality of common electrode lines may be arranged in a same layer.

According to an embodiment of the present disclosure, the plurality of common electrode lines and the plurality of gate lines may be arranged in a same layer.

According to an embodiment of the present disclosure, two adjacent gate lines and two adjacent data lines may define two pixel units, and two common electrode lines may be disposed between two adjacent gate lines.

According to an embodiment of the present disclosure, the pixel units located in a same row may be corresponding to one common electrode line, the projection of each of the common electrode lines on the substrate may be partially superposed with the projection, on the substrate, of a drain of the thin film transistor of each of the pixel units corresponding to the common electrode line, and a storage capacitor may be formed between the common electrode line and the drain of the thin film transistor of each of the pixel units corresponding to the common electrode line.

According to an embodiment of the present disclosure, the common electrode lines and the data lines may be arranged in a same layer.

According to an embodiment of the present disclosure, the display substrate may further include a plurality of assistant common electrode lines formed above the substrate, the assistant common electrode lines may be formed between two adjacent common electrode lines, and each of the connection electrodes may include a first connection sub-electrode and a second connection sub-electrode, the first connection sub-electrode may connect the assistant common electrode lines to one of the two adjacent common electrode lines, and the second connection sub-electrode may connect the assistant common electrode lines to the other one of the two adjacent common electrode lines.

According to an embodiment of the present disclosure, the assistant common electrode lines and the common electrode lines may be arranged in a same layer.

According to an embodiment of the present disclosure, two adjacent gate lines and two adjacent data lines may define two pixel units, the assistant common electrode lines may be located between the pixel electrodes of the two pixel units, and the projections of the assistant common electrode lines on the substrate may be partially superposed or not superposed with the projections of the pixel electrodes of the two pixel units on the substrate.

According to another aspect of the present disclosure, a display device is provided, including the display substrate provided by the present disclosure.

According to another aspect of the present disclosure, a method for manufacturing a display substrate is provided, including the following steps: forming gate lines, gates, common electrode lines and connection electrodes on a substrate; forming a gate insulating layer on the substrate with the gate lines, the grates, the common electrode lines and the connection electrodes formed thereon; forming an active layer on the gate insulating layer, the active layer being formed above the gates; forming data lines, sources and drains on the gate insulating layer and the active layer; forming a passivation layer to cover the gate insulating layer, the active layer, the data lines, the sources and the drains; forming via holes in the passivation layer for exposing part of the drains; and forming pixel electrodes on the passivation layer, the pixel electrodes being filled in the via holes so as to be electrically connected to the drains.

According to the display substrate and display device provided by the present disclosure, the connection electrodes connect adjacent common electrode lines, thereby realizing parallel connection of the common electrode lines, reducing the resistance on the common electrode lines, reducing the voltage drop on the common electrode lines and further improving the homogeneity of display.

DETAILED DESCRIPTION OF THE EMBODIMENTS

To make those skilled in the art better understand the technical solutions of the present disclosure, the display substrate and display device provided by the present disclosure will be described below in details in conjunction with the accompanying drawings.

Figure 1:
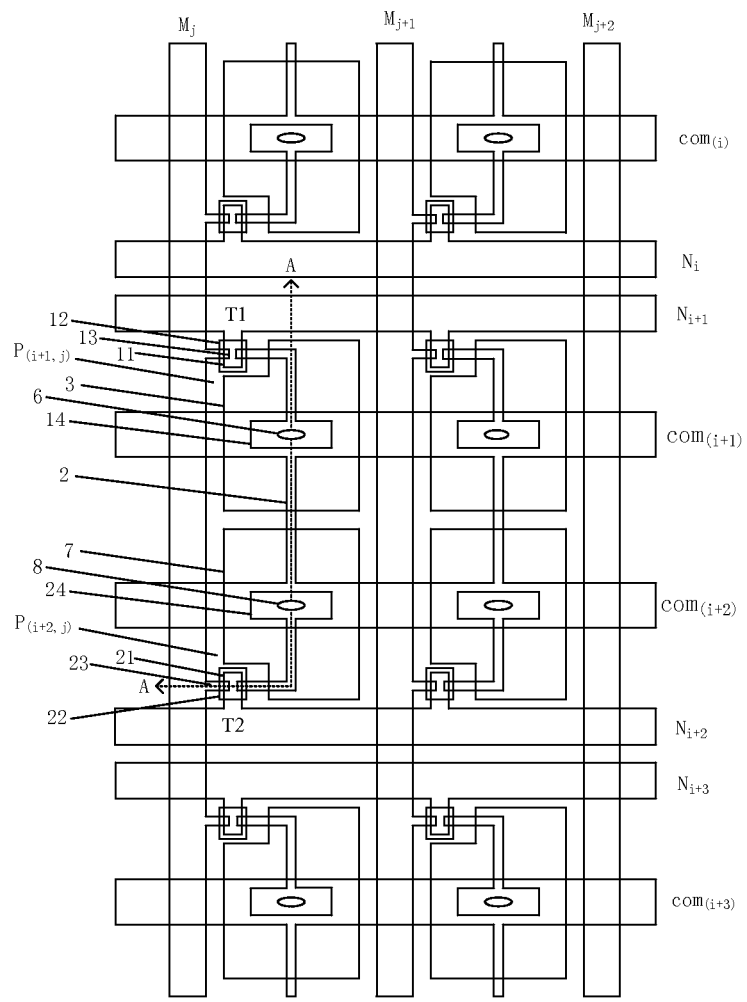
FIG. 1 is a structure diagram of a display substrate according to an embodiment of the present disclosure.
Figure 2:
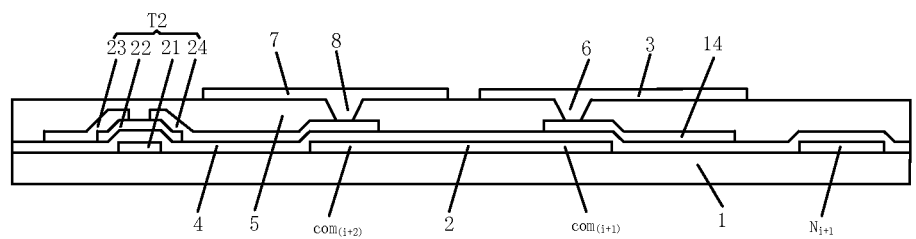
FIG. 2 is a section view taken along line A-A in FIG. 1.

FIG. 1 is a structure diagram of a display substrate according to an embodiment of the present disclosure, and FIG. 2 is a section view taken along line A-A in FIG. 1. As shown in FIG. 1 and FIG. 2, the display substrate may include a substrate 1, and a plurality of gate lines N, a plurality of data lines M and a plurality of common electrode lines com which are formed above the substrate 1. The gate lines and the data lines are crossed to form pixel units each including a thin film transistor and a pixel electrode electrically connected to the thin film transistor. The display substrate further includes connection electrodes 2 which are located above the substrate 1 and connect two adjacent common electrode lines $com_{(i+1)}$ and $com_{(i+2)}$.

According to the embodiment of the present disclosure, the display substrate may be an array substrate.

The plurality of gate lines N are arranged in parallel, and FIG. 1 schematically illustrates gate lines $N_i$, $N_{i+1}$, and $N_{i+2}$; the plurality of data lines M are arranged in parallel, and FIG. 1 schematically illustrates data lines $M_j$, $M_{j+1}$ and $M_{j+2}$; and, the plurality of common electrode lines com are arranged in parallel, and FIG. 1 schematically illustrates common electrode lines $com_{(i)}$, $com_{(i+1)}$, $com_{(i+2)}$ and $com_{(i+3)}$. According to this embodiment, two adjacent gate lines $N_{i+1}$ and $N_{i+2}$ and two adjacent data lines $M_j$ and $M_{j+1}$ define two pixel units $P_{(i+1,j)}$ and $P_{(i+2,j)}$.

The pixel units $P_{(i+1,j)}$ includes a thin film transistor T1 and a pixel electrode 3. The thin film transistor T1 is located nearby a cross point of the gate line $N_{i+1}$ and the data line $M_j$, and includes a gate 11, an active layer 12, a source 13 and a drain 14. The active layer 12 is located above the gate 11, the source 13 and the drain 14 are located above the active layer 12, and the pixel electrode 3 is electrically connected to the drain 14. The gate 11 is connected to the gate line $N_{i+1}$, and the gate 11 and the gate line $N_{i+1}$ may be integrally formed in a same layer. The source 13 is connected to the data line $M_j$, and the source 13 and the data line $M_j$ may be integrally formed in a same layer. A gate insulating layer 4 may be formed above the gate 11. A passivation layer 5 may be formed above the source 13 and the drain 14. One end of the source 13 may be located above the active layer 12, while the other end thereof may be located above the gate insulating layer 4. One end of the drain 14 may be located above the active layer 12, while the other end thereof may be located above the gate insulating layer 4. A via hole 6 may be provided in the passivation layer 5 for the purpose of exposing the drain 14. The pixel electrode 3 may be filled in the via hole 6 thus being electrically connected to the drain 14.

Similarly, the pixel unit $P_{(i+2,j)}$ includes a thin film transistor T2 and a pixel electrode 7. The thin film transistor T2 is located nearby a cross point of the gate line $N_{i+2}$ and the data line $M_j$, and includes a gate 21, an active layer 22, a source 23 and a drain 24. The active layer 22 is located above the gate 21, the source 23 and the drain 24 are located above the active layer 22, and the pixel electrode 7 is electrically connected to the drain 24. The gate 21 is connected to the gate line $N_{i+2}$, and the gate 21 and the gate line $N_{i+2}$ may be integrally formed in a same layer. The source 23 is connected to the data line $M_j$, and the source 23 and the data line $M_j$ may be integrally formed in a same layer. A gate insulating layer 4 may be formed above the gate 21. A passivation layer 5 may be formed above the source 23 and the drain 24. One end of the source 23 may be located above the active layer 22, while the other end thereof may be located above the gate insulating layer 4. One end of the drain 24 may be located above the active layer 22, while the other end thereof may be located above the gate insulating layer 4. A via hole 8 may be provided in the passivation layer 5 for the purpose of exposing the drain 24. The pixel electrode 7 may be filled in the via hole 8 thus being electrically connected to the drain 24.

The connection electrodes 2 and the common electrode lines may be arranged in a same layer. As shown in FIG. 1 and FIG. 2, the connection electrode 2 and the common electrode lines $com_{(i+1)}$ and $com_{(i+2)}$ are arranged in a same layer, and the connection electrode 2 is integrated with the common electrode lines $com_{(i+1)}$ and $com_{(i+2)}$. The connection electrode 2 connects two adjacent common electrode lines $com_{(i+1)}$ and $com_{(i+2)}$. Specifically, one end of the connection electrode 2 may be connected to the common electrode line $com_{(i+1)}$, while the other end thereof may be connected to the common electrode lines $com_{(i+2)}$. According to this embodiment, the connection electrodes 2 connect adjacent common electrode lines, thereby realizing parallel connection of the common electrode lines and reducing the resistance on the common electrode lines.

The common electrode lines com and the gate lines N may be arranged in a same layer. The common electrode lines com and the gate lines N may be parallel to each other, and the gate insulating layer 4 may be located above the common electrode lines com. According to this embodiment, two adjacent gate lines $N_{i+1}$ and $N_{i+2}$ and two adjacent data lines $M_j$ and $M_{j+1}$ define two pixel units $P_{(i+1,j)}$ and $P_{(i+2,j)}$, and two common electrode lines $com_{(i+1)}$ and $com_{(i+2)}$ are disposed between two adjacent gate lines $N_{i+1}$ and $N_{i+2}$. According to different practical applications, other numbers of common electrode lines may also be disposed between two adjacent gate lines.

The pixel units P in each row correspond to one common electrode line. For example, the pixel units P in the $(i+1)^{th}$ row correspond to the common electrode line $com_{(i+1)}$, and the pixel units P in the $(i+2)^{th}$ row correspond to the common electrode line $com_{(i+2)}$. Therefore, the pixel unit $P_{(i+1,j)}$ corresponds to the common electrode line $com_{(i+1)}$, and the pixel unit $P_{(i+2,j)}$ corresponds to the common electrode line $com_{(i+2)}$. According to this embodiment, the common electrode lines com may be located under the drains of the thin film transistors. For example, the common electrode line $com_{i+1}$ may be located under the drain 14 of the thin film transistor T1, while the common electrode line $com_{(i+2)}$ may be located under the drain 14 of the thin film transistor T2. The projection of each of the common electrode lines com on the substrate 1 may be partially superposed with the projection of the drain of the thin film transistor of each of the pixel units P corresponding to the common electrode line com on the substrate 1. For example, the projection of the common electrode line $com_{(i+1)}$ on the substrate 1 is partially superposed with the projection of the drain 14 of the thin film transistor T1 of the pixel unit $P_{(i+1,j)}$ on the substrate 1, and the projection of the common electrode line $com_{(i+2)}$ on the substrate 1 is partially superposed with the projection of the drain 24 of the thin film transistor T2 of the pixel unit $P_{(i+2,j)}$ on the substrate 1. A storage capacitor may be formed between each of the common electrode lines com and the drain of the thin film transistor of each of the pixel units corresponding to this common electrode line com. For example, a storage capacitor C1 is formed between the common electrode line $com_{(i+1)}$ and the drain 14 of the thin film transistor T1 of the pixel unit $P_{(i+1,j)}$, and a storage capacitor C2 is formed between the common electrode line $com_{(i+2)}$ and the drain 24 of the thin film transistor T2 of the pixel unit $P_{(i+2,j)}$.

According to the embodiment of the present disclosure, the gate lines N, the common electrode lines com and the data lines M may all be made from metal or metal alloy, for example, Cu, Al, Mo, Ti, Cr, W or alloys thereof.

According to the embodiment of the present disclosure, the gate lines N, the common electrode lines com and the data lines M may be of a single-layer structure or a multilayer structure. For example, the multilayer structure may be Mo\Al\Mo, Ti\Cu\Ti or Mo\Ti\Cu.

According to the embodiment of the present disclosure, the gate insulating layer 4 may be made from silicon nitride or silicon dioxide, and the gate insulating layer 4 may be of a single-layer structure or a multilayer structure. For example, the multilayer structure may be silicon nitride\silicon dioxide.

According to the embodiment of the present disclosure, the active layers 12 and 22 may be made from amorphous silicon or oxide semiconductor.

According to the embodiment of the present disclosure, the passivation layer 5 may be made from an inorganic substance, for example, nitrogen oxide.

According to the embodiment of the present disclosure, the pixel electrodes 3 and 7 may be made from ITO, IZO or other transparent metal oxides.

According to different practical applications, the common electrode lines com and the data lines M may be arranged in a same layer. In this case, the common electrode lines com may be parallel to the data lines M.

The thin film transistors T1 and T2 shown in this embodiment are both bottom gate type thin film transistors. According to different practical applications, the thin film transistors may also be top gate type thin film transistors.

Figure 3:
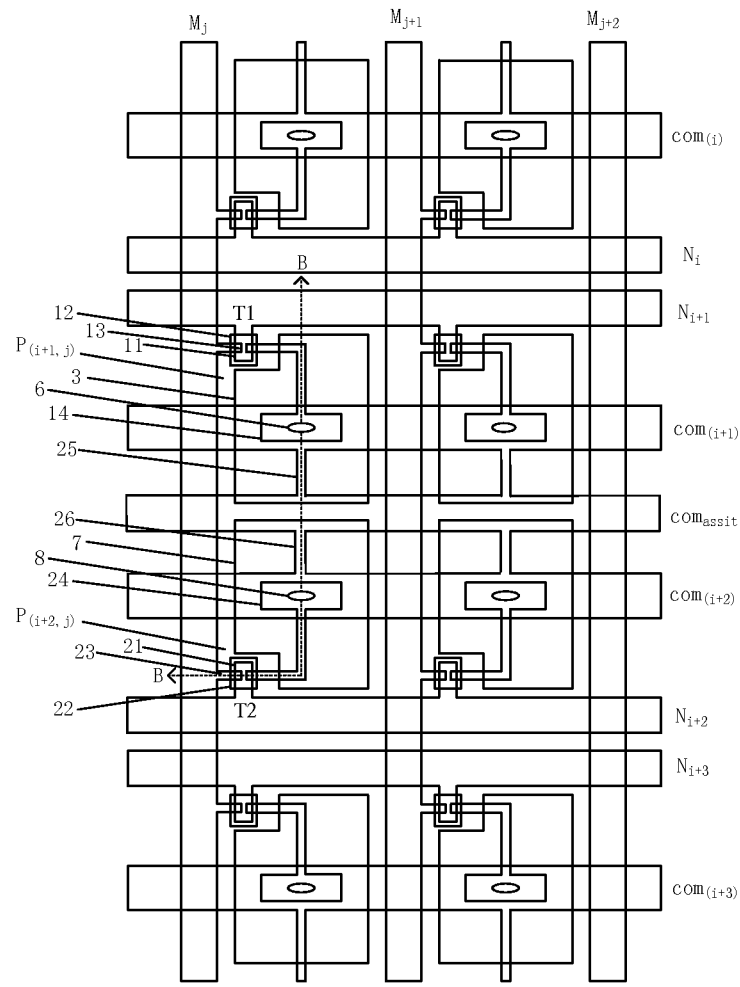
FIG. 3 is a structure diagram of a display substrate according to another embodiment of the present disclosure.
Figure 4:
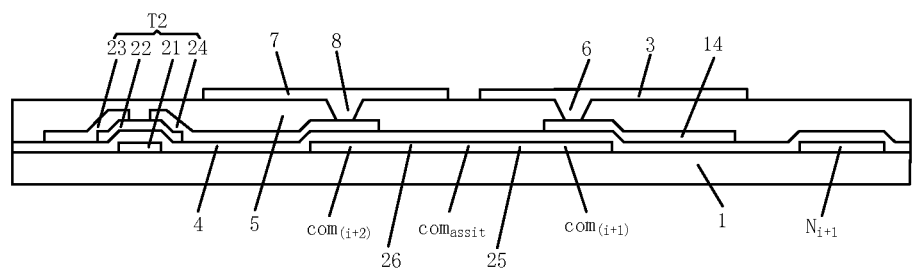
FIG. 4 is a section view taken along line B-B in FIG. 3.
Figure 5:
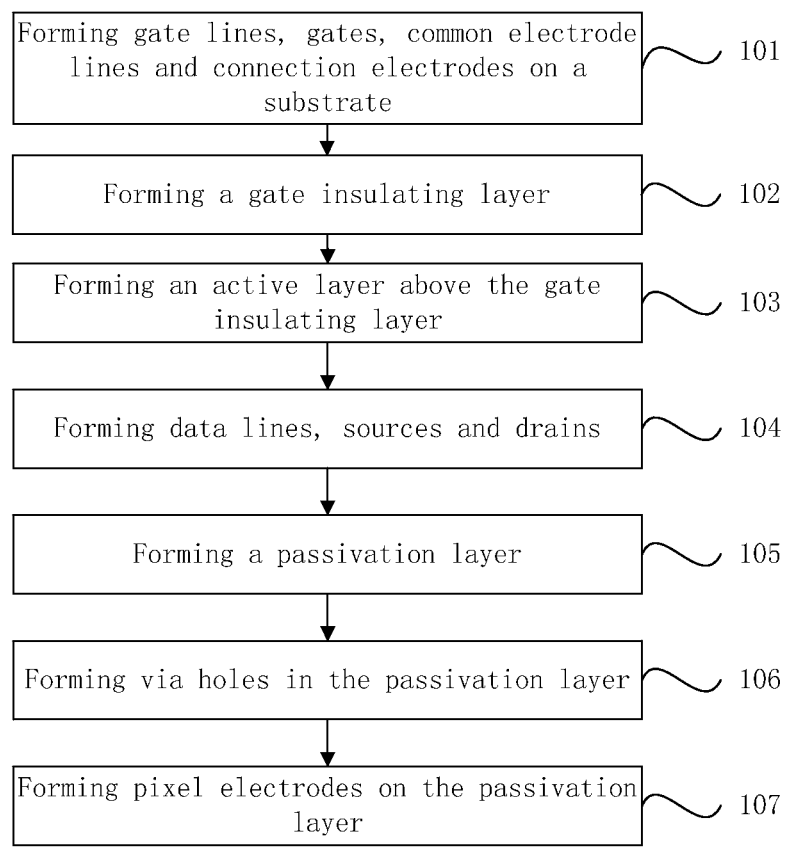
FIG. 5 is a flow chart of a method for manufacturing a display substrate according to an embodiment of the present disclosure.

FIG. 3 is a structure diagram of a display substrate according to another embodiment of the present disclosure, and FIG. 4 is a section view taken along line B-B in FIG. 3. As shown in FIG. 3 and FIG. 4, differences between this embodiment and the above embodiment lie in that: in this embodiment, the display substrate may further include a plurality of assistant common electrode lines $com_{assit}$ formed above the substrate 1, and the assistant common electrode lines $com_{assit}$ may be located between two adjacent common electrode lines com; each of the connection electrodes 2 may include a first connection sub-electrode 25 and a second connection sub-electrode 26, the first connection sub-electrode 25 may connect the assistant common electrode lines $com_{assit}$ to one of the two adjacent common electrode lines com, and the second connection sub-electrode 26 may connect the assistant common electrode lines $com_{assit}$ to the other one of the two adjacent common electrode lines com.

As shown in FIG. 3, the assistant common electrode lines com assit are located between two adjacent common electrode lines $com_{(i+1)}$ and $com_{(i+2)}$, the first connection sub-electrode 25 connects the assistant common electrode lines $com_{assit}$ and the common electrode line $com_{(i+1)}$, and the second connection sub-electrode 26 connects the assistant common electrode lines $com_{assit}$ and the common electrode line $com_{(i+2)}$. The first connection sub-electrode 25, the second connection sub-electrode 26, the assistant common electrode lines com assit and the common electrode lines $com_{(i+1)}$ and $com_{(i+2)}$ may be formed integrally. According to this embodiment, the first connection sub-electrode 25 and the second connection sub-electrode 26 are connected to the common electrode line $com_{(i+1)}$ and the common electrode line $com_{(i+2)}$, respectively, thereby realizing parallel connection of the assistant common electrode lines com assit and the common electrode lines com and further reducing the resistance on the common electrode lines.

The assistant common electrode lines $com_{assit}$ and the common electrode lines com may be arranged in a same layer. The assistant common electrode lines $com_{assit}$ and the common electrode lines com may be parallel to each other, and the gate insulating layer 4 is located above the assistant common electrode lines $com_{assit}$.

According to this embodiment, two adjacent gate lines $N_{i+1}$ and $N_{i+2}$ and two adjacent data lines $M_j$ and $M_{j+1}$ define two pixel units $P_{(i+1,j)}$ and $P_{(i+2,j)}$, and the assistant common electrode lines $com_{assit}$ are disposed between pixel electrodes 3 and 7 of the two pixel units $P_{(i+1,j)}$ and $P_{(i+2,j)}$. The projections of the assistant common electrode lines on the substrate 1 are partially superposed with the projections of the pixel electrodes 3 and 7 of the two pixel units $P_{(i+1,j)}$ and $P_{(i+2,j)}$ on the substrate 1. According to different practical applications, the projections of the assistant common electrode lines $com_{assit}$ on the substrate 1 may be not superposed with the projections of the pixel electrodes of the pixel units P on the substrate 1.

The remaining structure of this embodiment is similar to that of the above-mentioned embodiment, and will not be repeated here.

The display substrate according to the embodiment of the present disclosure may be applied in various display devices.

The present disclosure further provides a method for manufacturing a display substrate, including the following steps:

forming gate lines, gates, common electrode lines and connection electrodes on a substrate (101);

forming a gate insulating layer on the substrate with the gate lines, the grates, the common electrode lines and the connection electrodes formed thereon (102);

forming an active layer on the gate insulating layer, the active layer being formed above the gates (103);

forming data lines, sources and drains on the gate insulating layer and the active layer (104);

forming a passivation layer to cover the gate insulating layer, the active layer, the data lines, the sources and the drains (105);

forming via holes in the passivation layer for exposing part of the drains (106); and forming pixel electrodes on the passivation layer, the pixel electrodes being filled in the via holes so as to be electrically connected to the drains (107).

Specifically, in step 101, a gate material layer is sputtered on the substrate and then patterned to form the gate lines, gates, common electrode lines and connection electrodes. The connection electrodes connect two adjacent common electrode lines.

In addition, at the same time of forming the gate lines, gates, common electrode lines and connection electrodes, assistant common electrode lines may also be formed. In this case, each of the connection electrodes may include a first connection sub-electrode and a second connection sub-electrode for connecting the assistant common electrode lines and two adjacent common electrode lines, respectively.

In step 102, the gate insulating layer is deposited by Plasma Enhanced Chemical Vapor Deposition (PECVD) process, so that the gate insulating layer is located above the gate lines, the gates, the common electrode lines and the connection electrodes, or located above the gate lines, the gates, the common electrode lines, the assistant common electrode lines and the connection electrodes.

In step 103, an active material layer may be formed above the gate insulating layer by a spluttering process or PECVD process and then patterned to form the active layer.

In step 104, a source-drain material layer may be deposited by the spluttering process and then patterned to form the data lines, sources and drains.

In step 105, a passivation layer may be deposited by the PECVD process to cover the components thereunder.

In step 106, the passivation layer is patterned to form via holes which expose part of the drains.

In step 107, a pixel electrode material layer is deposited by the spluttering process and then patterned to form pixel electrodes.

The patterning process may include photoresist coating, exposure, developing, etching, photoresist lift-off and other processes.

The method provided by this embodiment shows the steps of manufacturing pixel units having bottom gate type thin film transistors. According to different practical applications, the thin film transistors of the pixel units may also be top gate type thin film transistors.

It should be understood that, the above embodiments are merely exemplary embodiments for illustrating the principle of the present disclosure, however, the present disclosure is not limited thereto. Various variations and improvements can be made by the person skilled in the art, without departing from the spirit and essence of the present disclosure, and these variations and improvements should also be considered falling within the protection scope of the present disclosure.

The invention claimed is:

1. A display substrate, comprising a substrate, and a plurality of gate lines, a plurality of data lines and a plurality of common electrode lines which are formed above the substrate, the plurality of gate lines and the plurality of data lines being crossed to form a plurality of pixel units, each of the plurality of pixel units comprising a thin film transistor and a pixel electrode electrically connected to the thin film transistor, wherein the display substrate further comprises connection electrodes located above the substrate, each of the connection electrodes connecting two adjacent common electrode lines, wherein two adjacent gate lines and two adjacent data lines define two pixel units, and two common electrode lines are disposed between two adjacent gate lines.

2. The display substrate according to claim 1, wherein the connection electrodes and the plurality of common electrode lines are arranged in a same layer.

3. The display substrate according to claim 1, wherein the plurality of common electrode lines and the plurality of gate lines are arranged in a same layer.

4. The display substrate according to claim 1, wherein the pixel units located in a same row correspond to one common electrode line, the projection of each of the common electrode lines on the substrate is partially superposed with the projection, on the substrate, of a drain of the thin film transistor of each of the pixel units corresponding to the common electrode line, and a storage capacitor is formed between the common electrode line and the drain of the thin film transistor of each of the pixel units corresponding to the common electrode line.

5. The display substrate according to claim 1, wherein the common electrode lines and the data lines are arranged in a same layer.

6. The display substrate according to claim 1, wherein the display substrate further comprises a plurality of assistant common electrode lines formed above the substrate, the assistant common electrode lines are formed between two adjacent common electrode lines, and each of the connection electrodes comprises a first connection sub-electrode and a second connection sub-electrode, the first connection sub-electrode connecting the assistant common electrode lines to one of the two adjacent common electrode lines, the second connection sub-electrode connecting the assistant common electrode lines to the other one of the two adjacent common electrode lines.

7. The display substrate according to claim 6, wherein the assistant common electrode lines and the common electrode lines are arranged in a same layer.

8. The display substrate according to claim 6, wherein the assistant common electrode lines are located between the pixel electrodes of the two pixel units, and the projections of the assistant common electrode lines on the substrate are partially superposed or not superposed with the projections of the pixel electrodes of the two pixel units on the substrate.

9. A display device comprising the display substrate according to claim 1.

10. The display device according to claim 9, wherein the connection electrodes and the plurality of common electrode lines are arranged in a same layer.

11. The display device according to claim 9, wherein the plurality of common electrode lines and the plurality of gate lines are arranged in a same layer.

12. The display device according to claim 9, wherein the pixel units located in a same row correspond to one common electrode line, the projection of each of the common electrode lines on the substrate is partially superposed with the projection, on the substrate, of a drain of the thin film transistor of each of the pixel units corresponding to the common electrode line, and a storage capacitor is formed between the common electrode line and the drain of the thin film transistor of each of the pixel units corresponding to the common electrode line.

13. The display device according to claim 9, wherein the common electrode lines and the data lines are arranged in a same layer.

14. The display device according to claim 9, wherein the display substrate further comprises a plurality of assistant common electrode lines formed above the substrate, the assistant common electrode lines are formed between two adjacent common electrode lines, and each of the connection electrodes comprises a first connection sub-electrode and a second connection sub-electrode, the first connection sub-electrode connecting the assistant common electrode lines to one of the two adjacent common electrode lines, the second connection sub-electrode connecting the assistant common electrode lines to the other one of the two adjacent common electrode lines.

15. The display device according to claim 14, wherein the assistant common electrode lines and the common electrode lines are arranged in a same layer.

16. The display device according to claim 14, wherein the assistant common electrode lines are located between the pixel electrodes of the two pixel units, and the projections of the assistant common electrode lines on the substrate are partially superposed or not superposed with the projections of the pixel electrodes of the two pixel units on the substrate.

\* \* \* \* \*